(12) United States Patent
Manzi et al.

(45) Date of Patent: May 25, 2021
(10) Patent No.: US 11,018,924 B1

(54) SPOILED CODE TRELLIS CODED MODULATION

(71) Applicant: Raytheon Company, Waltham, MA (US)

(72) Inventors: David G. Manzi, Tucson, AZ (US); Robert L. Leatham, Tucson, AZ (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 16/813,663

(22) Filed: Mar. 9, 2020

(51) Int. Cl.
*H04L 27/36* (2006.01)
*H03M 13/25* (2006.01)
*H04L 27/38* (2006.01)

(52) U.S. Cl.
CPC .......... *H04L 27/36* (2013.01); *H03M 13/256* (2013.01); *H04L 27/38* (2013.01)

(58) Field of Classification Search
CPC ..... H04L 27/34; H04L 1/0071; H04B 7/0421; H04B 7/0456
USPC .................................................. 375/298, 130
See application file for complete search history.

(56) References Cited

U.S. PATENT DOCUMENTS

| | | | |
|---|---|---|---|
| 10,491,261 B1 | 11/2019 | Al-Eidan | |
| 2007/0211829 A1* | 9/2007 | Liang | H04L 25/03834 375/320 |
| 2010/0061479 A1* | 3/2010 | Mazet | H04L 27/3488 375/295 |
| 2011/0090988 A1 | 4/2011 | Brillant et al. | |
| 2019/0147950 A1* | 5/2019 | Ying | G11C 13/0007 365/148 |
| 2020/0259697 A1* | 8/2020 | Delfeld | H04B 7/0421 |

FOREIGN PATENT DOCUMENTS

| CN | 105 897 642 B | 4/2019 |
|---|---|---|
| EP | 2 146 454 A2 | 1/2010 |

OTHER PUBLICATIONS

International Search Report for corresponding International Application No. PCT/US2020/053154, filed Sep. 28, 2020, International Search Report dated Dec. 17, 2020 and dated Jan. 13, 2021 (5 pgs.).
Written Opinion of the International Searching Authority for corresponding International Application No. PCT/US2020/053154, filed Sep. 28, 2020, Written Opinion of the International Searching Authority dated Jan. 13, 2021 (4 pgs.).

* cited by examiner

*Primary Examiner* — Khai Tran
(74) *Attorney, Agent, or Firm* — Lewis Roca Rothgerber Christie LLP (57) ABSTRACT

A method of generating a transmit signal by a transmitter for transmission to a receiver includes receiving input data, generating a base symbol signal, the base symbol signal, generating a perturbation signal based on the input data, and combining the base symbol signal and the perturbation signal to generate the transmit signal.

19 Claims, 6 Drawing Sheets

SPOILED CODE TRELLIS CODED MODULATION

FIELD

Aspects of the present disclosure relate to communication of spectrally dense encoded data.

BACKGROUND

Generally, spectrally dense modulation schemes such as quadrature amplitude modulation (QAM) utilize non-constant envelope transmissions, which require the use of amplifiers with high degrees of linearity (i.e., high dynamic range) which are power inefficient and result in excess heat.

Current methods of improving power efficiency either utilize constant envelope waveforms which are fundamentally not spectrally efficient, or they utilize complex pre-distortion algorithms to account for the non-linearities inherent in power efficient power amplifiers. Communication systems based on such schemes are sensitive to changes in power amplifier (PA) performance, such as temperature induced variability. As such, such systems require sensor systems, such as thermocouples, feedback chains, etc., to monitor system performance. Further, systems that utilize complex pre-distortion algorithms may rely on complex equalization calculations, as complexity grows with transmission chain complexity, which may mean that more components need to be linearized.

Thus, there is a need for a communication system capable of communication of spectrally dense, but covertly modulated and encoded data through a power efficient transmit chain, in particular for very high bandwidth signals.

The above information disclosed in this Background section is only for enhancement of understanding of the background of the disclosure and therefore it may contain information that does not constitute prior art.

SUMMARY

Aspects of example embodiments of the present disclosure are directed to a system and a method for transmitting spectrally dense, covertly modulated and encoded data in very high bandwidth signals through a power efficient and saturated transmit chain.

According to some embodiments of the present disclosure, there is provided a method of generating a transmit signal by a transmitter for transmission to a receiver, the method including: receiving input data; generating a base symbol signal; generating a perturbation signal based on the input data, at least one of the base symbol signal or the perturbation signal having a constant magnitude and a variable phase; and combining the base symbol signal and the perturbation signal to generate the transmit signal.

In some embodiments, the transmit signal has a constant envelope and a phase modulated by a combination of the base and perturbation signals.

In some embodiments, the perturbation signal corresponds to a constellation point of a modulation scheme of the transmitter.

In some embodiments, the perturbation signal has a constant magnitude and a variable phase.

In some embodiments, the perturbation signal is configured to induce a non-constant envelope response at the receiver.

In some embodiments, the transmit signal is expressed as $$S_{TX}(t) = \sum_k s_c(t-kT) s_{P_{s[k]}}(t-kT),$$

wherein k represents an index of symbols being transmitted, t represents time, T represents a symbol period, $S_{TX}(t)$ is the transmitted signal, $s_c(t)$ is the base symbol signal, and $s_{P_s}(t)$ represents a set of perturbation signals indexed by s and including the perturbation signal, and s[k] represents an identified perturbation index s for the symbol k.

In some embodiments, at least two permutation signals of the set of perturbation signals can be configured to induce a same symbol at the receiver.

In some embodiments, the base symbol signal $s_c(t)$ and the perturbation signal $s_{P_s}(t)$ are respectively expressed as:

$$s_c(t) = \begin{cases} e^{jc(t)}, & 0 \leq t < T \\ 0, & \text{else} \end{cases},$$

$$s_{P_s}(t) = \begin{cases} e^{jp_s(t)}, & 0 \leq t < T \\ 0, & \text{else} \end{cases},$$

where c(t) is the phase-modulating signal for the base symbol signal, and $p_s(t)$ is one of a set of phase-modulating perturbation signals indexed by s.

In some embodiments, the phase-modulating signal is a spreading code signal.

In some embodiments, an integral of the perturbation signal $s_{P_s}(t)$ over the symbol period has phase and amplitude components of a corresponding constellation point of a modulation scheme of the transmitter.

In some embodiments, a template signal for interpreting received symbols by the receiver is an unperturbed transmitted signal $S_{TX_0}(t)$ expressed as:

$$S_{TX_0}(t) = \sum_k s_c(t-kT).$$

In some embodiments, a phase transition between a consecutive pair of perturbation signals of the set of perturbation signals is continuous and passes through a predetermined phase location or locations.

In some embodiments, a phase transition between a consecutive pair of perturbation signals of the set of perturbation signals is discontinuous.

In some embodiments, the generating the perturbation signal set is further based on a modulation scheme including binary phase-shift keying (BPSK), forward error correction (FEC), quadrature amplitude modulation (QAM), trellis coded modulation (TCM), QAM with FEC, QAM TCM, or the like.

In some embodiments, the transmitter includes a power amplifier configured to transmit the transmit signal while operating in saturation mode.

In some embodiments, the method further includes: encoding the input data to enable error correction at the receiver, wherein the generating the perturbation signal is based on the encoded input data.

In some embodiments, the base symbol signal has a constant magnitude and a variable phase According to some embodiments of the present disclosure, there is provided a system for generating a transmit signal for transmission to a receiver, the system including: a memory; and a processing circuit configured to perform: receiving input data; generating a base symbol signal; generating a perturbation signal based on the input data, at least one of the base symbol signal or the perturbation signal having a constant magnitude and a variable phase; and combining the base symbol signal and the perturbation signal to generate the transmit signal.

BRIEF DESCRIPTION OF THE DRAWINGS

These and other features of some example embodiments of the present disclosure will be appreciated and understood with reference to the specification, claims, and appended drawings, wherein:

DETAILED DESCRIPTION

The detailed description set forth below in connection with the appended drawings is intended as a description of some example embodiments of a system and a method for mitigating the effects of compression errors provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Aspects of example embodiments of the present disclosure are directed to a method of perturbing a transmitted signal for the purposes of inducing specific outputs in a receiver that mimic the outputs of a non-constant envelope (non-saturated) transmitter. In some embodiments, this method combines such signal perturbation with other signal generation and processing methods to facilitate various performance gains that are generally not achievable with saturated transmitters.

According to some embodiments, the communication system utilizes a constant envelope transmission to first spread the transmitted signal out spectrally, thus providing covertness and jam immunity, and then perturbs this spreading signal on a symbol-by-symbol basis to induce non-constant envelope responses at the receiver. Thus, aspects of the present invention combine two desirable features: covertness/jam immunity and spectral efficiency while allowing for the use of high-power efficient amplifiers.

The communication system, according to some embodiments, may be employed in high bandwidth, high-frequency communications in which power efficiency is a significant consideration. In some examples, the communication system may be employed in military covert and protected communications (e.g., an area denial weapon or Anti Access/Area Denial (A2/AD) weapon system) or commercial code-division multiple access (CDMA) based communication systems with improved built-in authentication and transmission obfuscation capabilities (e.g., to protect commercial networks against bad actors).

Figure 1:
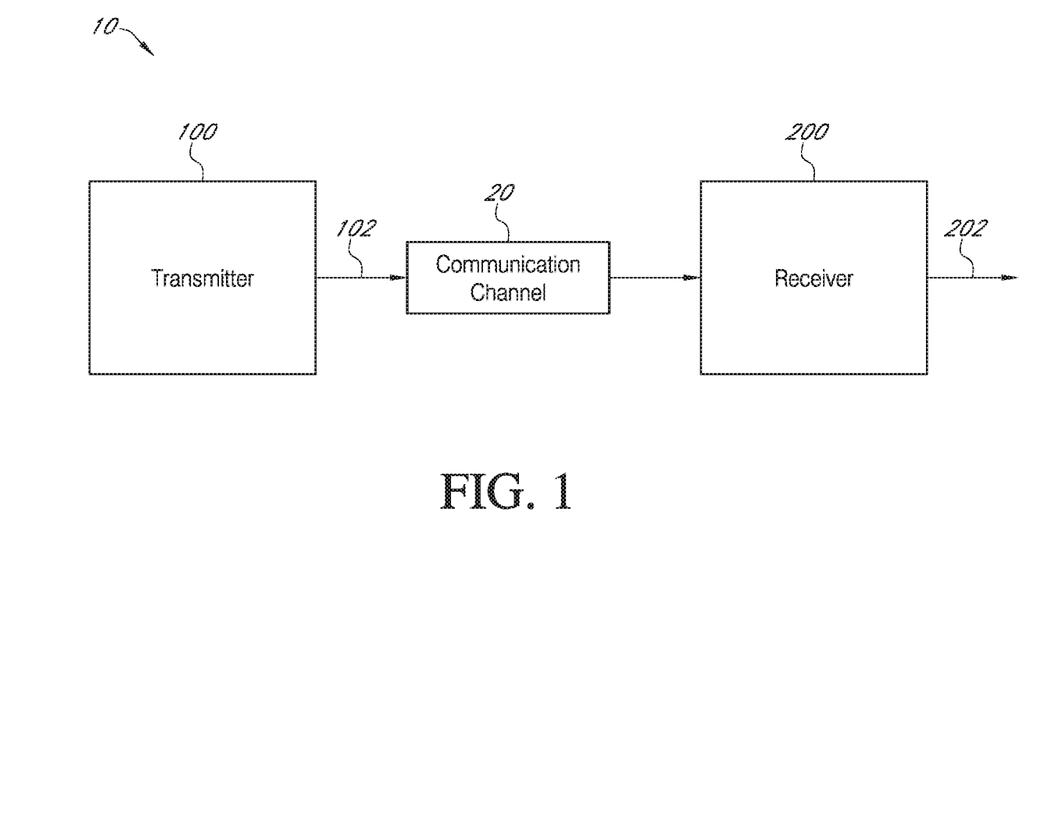
FIG. 1 is a block diagram of a communication system according to some example embodiments of the present invention.
Figure 2A:
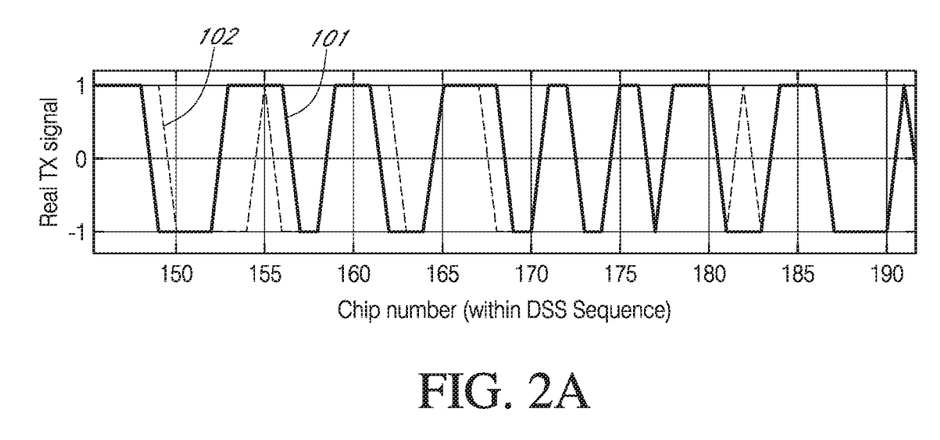
FIGS. 2A-2B respectively illustrate the real component and the imaginary component of a transmitted signal with and without perturbation applied, according to some example embodiments of the present invention.
Figure 2B:
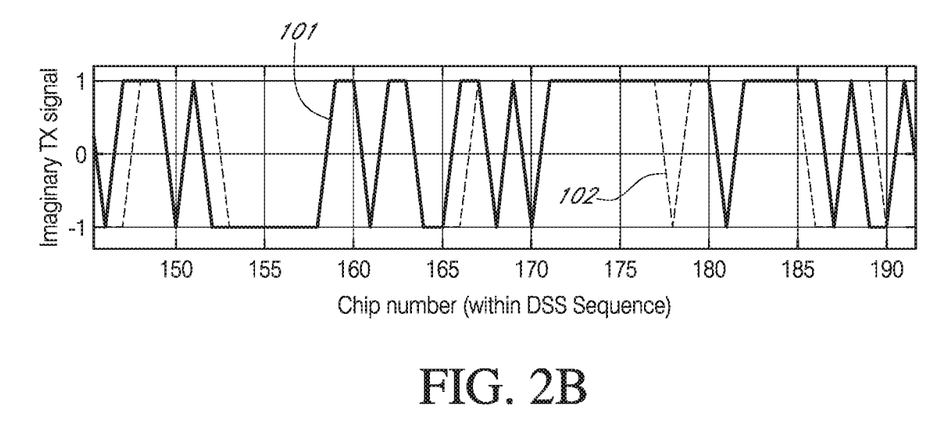
Figure 3:
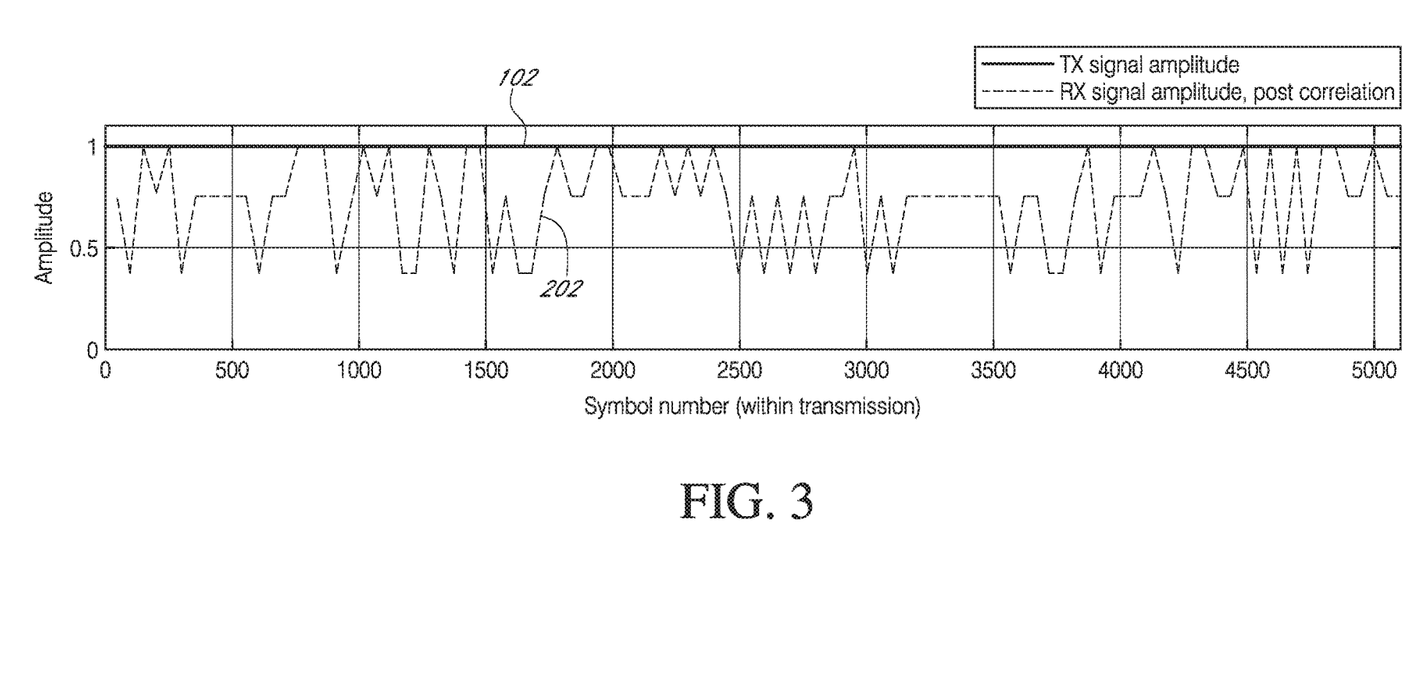
FIG. 3 illustrates the amplitudes of the transmitted signal generated by a transmitter and the recovered signal output amplitude of a receiver, according to some example embodiments of the present invention.

FIG. 1 is a block diagram of a communication system 10 according to some embodiments of the present invention. FIGS. 2A and 2B respectively illustrate the real component and the imaginary component of a transmitted signal with and without perturbation applied, according to some example embodiments of the present invention. FIG. 3 illustrates the amplitudes of the transmitted signal generated by the transmitter 100 and the recovered signal output amplitude of the receiver 200, according to some example embodiments of the present invention.

According to some embodiments, the communication system 10 includes a transmitter 100 and a receiver 200. The transmitter 100 receives input data and utilizes a modulation scheme to transform the input data into a series of symbols, which correspond to signals with amplitude and phase components, in a manner than may provide high levels of spectrum usage efficiency. In some examples, the modulation scheme may include binary phase-shift keying (BPSK), forward error correction (FEC), quadrature amplitude modulation (QAM), trellis coded modulation (TCM), QAM with FEC, QAM TCM, or the like. The transmitter 100 may further employ a spread spectrum technique, such as direct sequence spread spectrum (DSSS) or frequency-hopping spread spectrum (FHSS) to improve security of transmission (e.g., prevent eavesdropping) and to protect against interfering (or jamming) signals.

The transmitted signal may pass through a communication channel 20 (e.g., air, a wire, an optical fiber, etc.), which may add electronic noise or distortion to the transmitted signal. As a result, the amplitude and phase received by the receiver 200 may differ from the correct value for the symbol, depending on the level of noise. The receiver 200 includes a demodulator that identifies the symbols corresponding to the received (noisy) signals, and reconstructs the input data (e.g., the binary input data) therefrom.

According to some embodiments, the transmitter 100 converts input data, which may be in digital form (e.g., binary '1's and '0's) to perturbed symbols for transmission. In some embodiments, the transmitter 100 uses spoiled code modulation (SCM) when running its power amplifier in saturated mode to preserve power efficiency. In this mode, the transmitter 100 transmits the same base signal for every symbol, and perturbs (e.g., the phase of) the base signal on a per symbol basis. While such perturbations (e.g., phase perturbations) of the base signal may induce sub-optimal correlations at the output of the receiver matched filter, proper selection of perturbation signals can allow for indexing of a non-constant envelope signal constellation (e.g., that of 16-/32-/64-QAM) while still transmitting a constant envelope signal, which can be done without using power-inefficient linear amplifiers.

Referring to FIGS. 2A-2B, according to some examples, the transmitter 100 may utilize rectangular pulse shapes and DSSS as base modulation for base symbol signals. In FIGS.

2A-2B, the signal 101 represents the unmodified DSSS signal (e.g., a signal with 51 chip QPSK spreading code), and the signal 102 represents the perturbed DSSS signal that is phase modulated. As illustrated in FIG. 3, while the transmitted perturbed DSSS signal 102 has a constant amplitude, the perturbations in the transmitted signal induce amplitude-varying responses 202 in the receiver 200.

Figure 4:
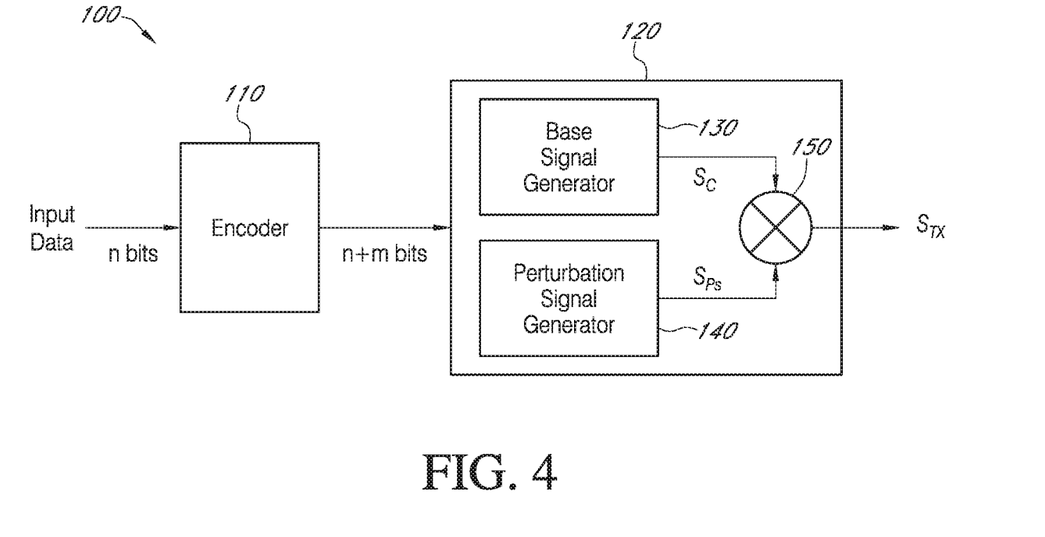
FIG. 4 is a block diagram of the transmitter, according to some example embodiments of the present invention.

FIG. 4 is a block diagram of the transmitter 100, according to some embodiments of the present invention.

Referring to FIG. 4, the transmitter 100 may include an encoder 110 for encoding the input data to enable error correction at the receiver. The encoder 110 may utilize forward error correction (FEC), a convolutional code (such as trellis code), and/or the like.

According to some embodiments, the transmitter 100 includes a modulator (e.g., a spoiled code modulator) 120 configured to generate a transmit signal with constant envelope and phase modulation, which can induce amplitude responses at the receiver 200. In some embodiments, the transmitter 100 includes a base signal generator 130 configured to generate a base symbol signal (e.g., a carrier signal), a perturbation signal generator 140 configured to generate a set of perturbation signals based on the input data or the encoded input data, and a combiner (e.g., a mixer) 150 for combining the outputs of the base signal generator 130 and the perturbation signal generator 140 to generate the transmit signal (shown as a mixer in FIG. 4). While FIG. 4 illustrates the transmitter 100 as including an encoder, embodiments of the present invention are not limited thereto. For example, the transmitter 100 may not employ an encoder and the input data may be applied to the input of the modulator 120 itself (e.g., to input of the perturbation signal generator 140). The perturbation signal generator 140 may generate a time domain signal that corresponds to the desired symbol to transmit, which is indexed by some bits provided to it. With error correction, the bits will be the output of the encoder.

According to some embodiments, the transmit signal can be expressed as:

$$S_{TX}(t) = \sum_k s_c(t - kT) s_{P_{s[k]}}(t - kT) \quad \text{(Eq. 1)}$$

where k represents the index of symbols being transmitted, t represents time, T represents the symbol period (or symbol duration), $S_{TX}(t)$ represents the signal transmitted by the transmitter 100, $s_c(t)$ represents the base symbol signal, and $s_{P_s}(t)$ represents a set of perturbation signals over s, and s[k] is the selected perturbation index s for the symbol k.

According to some embodiments, the same base symbol signal $s_c(t)$ is used for all symbols, while the perturbation signal $s_{P_s}(t)$ may differ for different symbols. The base symbol signal $s_c(t)$ and the perturbation signal $s_{P_s}(t)$ may be expressed as:

$$s_c(t) = \begin{cases} e^{jc(t)}, & 0 \leq t < T \\ 0, & \text{else} \end{cases} \quad \text{(Eq. 2)}$$

$$s_{P_s}(t) = \begin{cases} e^{jp_s(t)}, & 0 \leq t < T \\ 0, & \text{else} \end{cases} \quad \text{(Eq. 3)}$$

where c(t) is the phase-modulating signal for the base symbol signal, and $p_s(t)$ is one of a set of phase-modulating perturbation signals indexed by s. The phase-modulating signal c(t) can be any suitable time-domain signal (e.g., a constant value, a band-limited pseudo-noise signal, a rectangular signal, a pyramid-shaped signal, a spreading code signal such as the DSSS signal of FIGS. 2A-2B, etc.), and is the same for all symbols. Therefore, base symbol signal $s_c(t)$ alone does not carry any information corresponding to the input data. Rather, it is the perturbation signals $s_{P_s}(t)$ that carry the information corresponding to the input data. These perturbation signals $s_{P_s}(t)$ can also be any suitable time-domain signals as described above so long as they achieve the desired amplitude and phase response within the receiver 200.

In some examples, the index s represents the constellation point or symbol that the transmitter 100 intends to send. In some examples, the number of perturbation signal $s_{P_s}(t)$ may be the same as the number of points in the symbol constellation. However, given that more than one perturbation signal may yield the same constellation point, i.e., the same symbol, the total number of perturbation signals $s_{P_s}(t)$ may be greater than the number of constellations points in the modulation scheme. For example, in 64-QAM, the perturbation set may include 64 or more unique perturbation signals $s_{P_s}(t)$. Being able to use a large number of perturbation signals, and the fact that the receiver 200 need not have any knowledge of the perturbation set, further improves the obfuscation capability of the communication system 10.

While each of the phase-modulating signals $p_s(t)$ for the perturbation signal and the phase-modulating signal c(t) for the base symbol signal $s_c(t)$ may be a time-varying function over the symbol duration T, the magnitude of each perturbation signal $s_{P_s}(t)$, as well as the base symbol signal $s_c(t)$, is constant (e.g., 1, in the case of Equations 1-3). That is, the envelope of the transmitted signal is fixed and does not vary with time. As such, the transmitter 100 does not require the use of power-inefficient linear amplifiers with high dynamic range, and can instead rely on regular amplifiers operating in saturation (or near saturation), which can be power efficient.

According to some embodiments, all $p_s(t)$ sets will have a $p_0(t)$ where the signal is non-perturbing (e.g., equal to 0 in the, $0 \leq t < T$ range resulting in a $s_{p_0}(t)$ of 1 in the same range). Thus, the unperturbed transmitted signal $S_{TX_0}(t)$ may be expressed as:

$$S_{TX_0}(t) = \sum_k s_c(t - kT) \quad \text{(Eq. 4)}$$

$S_{TX_0}(t)$ also represents the template signal that is used at the receiver 200 to interpret the received symbols.

The receiver 200 includes a fixed matched filter corresponding to the base symbol, and determines what symbols were transmitted by correlating the received signal with the template signal (e.g., by convolving the received signal with the conjugated, time-reversed template signal). At the timing alignment within the convolution with the matched filter that corresponds to maximum correlation the output of the receiver 200 may be expressed as:

$$S_{RX}(t) = (S_{TX}(t) + n(t)) S^*_{TX_0}(t) \quad \text{(Eq. 5)}$$

where $S_{RX}(t)$ represents the output signal generated by the receiver 200, n(t) represents the additive channel noise of the communication channel 20, $S_{TX}(t) + n(t)$ represents the signal received by the receiver 200, and $S_{TX_0}^*(t)$ represents the complex conjugate of the template signal $S_{TX_0}(t)$ of Equation 4. Using Equations 1 and 4, Equation 5 can be expressed as:

$$S_{RX}(t) = \left(\sum_k s_c(t-kT)s_{P_{s[k]}}(t-kT) + n(t)\right)\sum_k s_c^*(t-kT) \quad \text{(Eq. 6)}$$

Since all terms in both summations have non-overlapping extents, this Equation may be simplified as:

$$S_{RX}(t) = \left(\sum_k s_c(t-kT)s_c^*(t-kT)s_{P_{s[k]}}(t-kT) + n(t)\right)\sum_k s_c^*(t-kT) \quad \text{(Eq. 7)}$$

Looking at any symbol k and its associated period, the formula can be simplified further as follows:

$$S_{RX_{[k]}}(t) = s_c(t-kT)s_c^*(t-kT)s_{P_{s[k]}}(t-kT) + n(t)s_c^*(t-kT) \quad \text{(Eq. 8)}$$

By ignore the translation effect of the symbol position in time (i.e., the translation by $-kT$) and by assuming that the channel noise $n(t)$ is additive white Gaussian noise (AWGN), and hence ergodic, Equation 8 may be rewritten as:

$$S_{RX_{[k]}}(t) = s_c(t)s_c^*(t)s_{P_{s[k]}}(t) + n(t)s_c^*(t) \quad \text{(Eq. 9)}$$

$$S_{RX_{[k]}}(t) = e^{jc(t)}e^{-jc(t)}s_{P_{s[k]}}(t) + n(t)s_c^*(t) \quad \text{(Eq. 10)}$$

$$S_{RX_{[k]}}(t) = e^{jp_{s[k]}(t)} + n(t)s_c^*(t) \quad \text{(Eq. 11)}$$

Figure 5A:
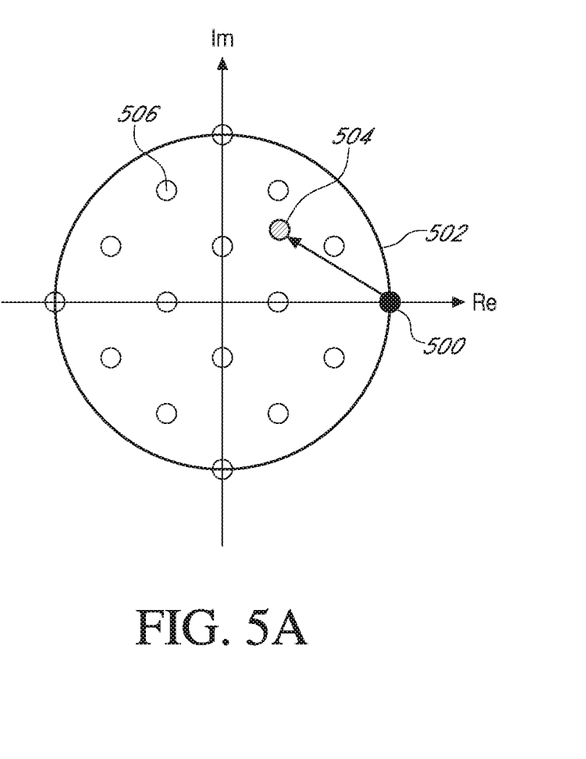
FIGS. 5A-5C are constellation diagrams of a rectangular 16-QAM transmission, according to some example embodiments of the present invention.
Figure 5B:
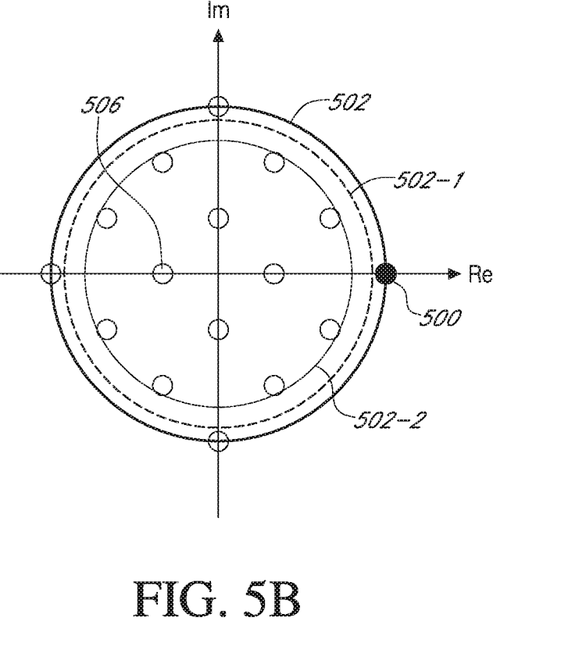
Figure 5C:
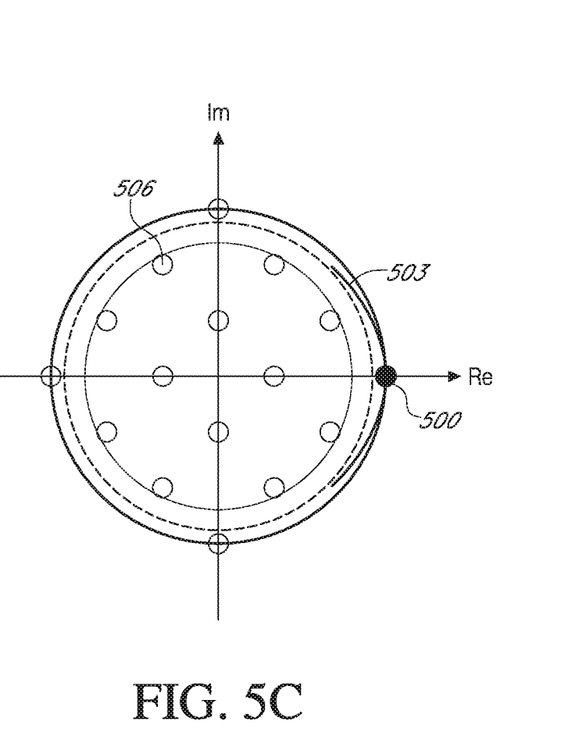

Integrating over each symbol period (and thus completing the convolution) will result in the effective received value for that symbol:

$$R[k] = \int_{(k-1)T}^{kT} S_{RX}(t)\,dt = \int_0^T (e^{jp_{s[k]}(t)} + n(t)s_c^*(t))\,dt = \quad \text{(Eq. 12)}$$
$$\int_0^T e^{jp_{s[k]}(t)}\,dt + \int_0^T n(t)s_c^*(t)\,dt = \int_0^T e^{jp_{s[k]}(t)}\,dt + n'$$

wherein the term $$\int_0^T e^{jp_{s[k]}(t)}$$

dt is the constellation point for symbol k and the term $$\int_0^T n(t)s_c^*(t)$$

dt, or n', is the symbol noise. Thus, the perturbation of a constant-envelope transmitted signal via phase modulation can induce amplitude responses corresponding to different constellation points at the receiver 100. This effect is further described with reference to FIGS. 5A-5C, as described below.

FIGS. 5A-5C are constellation diagrams of a rectangular 16-QAM transmission, according to some example embodiments of the present invention.

Referring to FIG. 5A, the constellation point 500 on the real axis represents the ideal correlation resulting from using $p_0(t)$ to transmit a non-perturbed base symbol signal $S_{TX_0}(t)$ (see, Equations 3-4). According to some embodiments, the perturbation signal $s_{p_s}(t)$ can move the symbol value recovered by the receiver 200 to anywhere 504 within a circle 502 whose radius matches the magnitude of the unperturbed signal 500, including to any set of points 506 that could be used to define a constellation a digital modulation scheme (e.g., trellis coded modulation (TCM)). As expressed in Equation 3, the perturbation signal $s_{p_s}(t)$ is always on the circle 504; however, the summation (or equivalently, the average) of the perturbation signal $s_{p_s}(t)$ during a symbol period (i.e., $\int_0^T e^{jp_{s[k]}(t)}\,dt$) can be any point 504 within the circle 502.

The consecutive perturbations need not be continuous in phase (i.e., can jump around in phase), which, in a communication system that does not require phase continuity, can improve signal obfuscation since the transmitted signal can appear even more noise-like to an eavesdropper. However, in some systems, discontinuities in phase between consecutive perturbation signals $s_{p_s}(t)$ may lead to ringing or other undesirable side-effects, and thus, it may be desirable to have consecutive perturbations that are continuous in phase (and, e.g., pass through a predetermined phase location). For example, it may be desirable to have the perturbation signal $s_{p_s}(t)$ always start and end at the same point (e.g., at the unperturbed point 500).

Referring to FIG. 5B, the circle 502 represents the maximum addressable amplitude when transitioning between two symbols within a quadrant, the circle 502-1 represents the maximum addressable amplitude when transitioning between adjacent quadrants (i.e., 90° shifted quadrants), and the circle 502-2 represents the maximum addressable amplitude when transitioning between opposite quadrants (i.e., 180° shifted quadrants). As shown in FIG. 5C, the circles 502, 502-1, and 502-2 are not perfect circles, and may in fact be slightly ellipsoidal in shape (here, the specific shape may be driven by the specific nature of the perturbation signals used). This is exemplified by line 503, for which, the circle 502 is intended to be an approximation.

Figure 6:
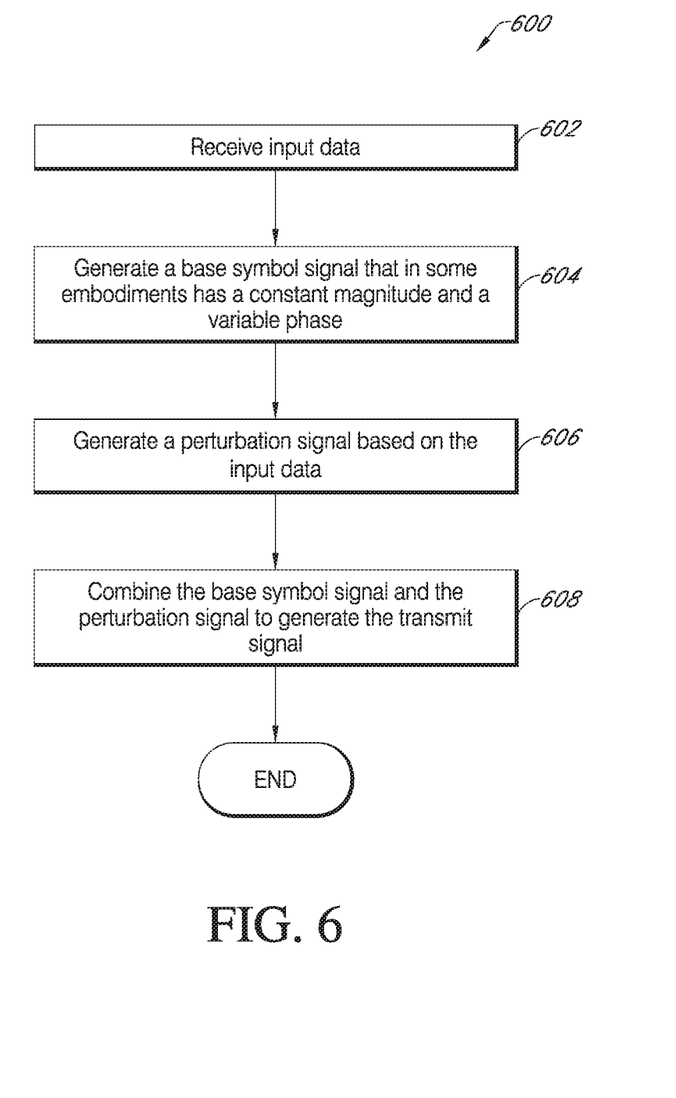
FIG. 6 is a flow diagram of a process 600 of generating a transmit signal by a transmitter for transmission to a receiver, according to some example embodiments of the present invention.

FIG. 6 is a flow diagram of a process 600 of generating a transmit signal by a transmitter for transmission to a receiver, according to some example embodiments of the present invention.

According to some embodiments, the transmitter 100 receives input data (602), generates a base symbol signal (604), generates a perturbation signal based on the input data (606), and combines the base symbol signal and the perturbation signal to generate the transmit signal (608). In some embodiments, the base symbol signal that has a constant magnitude and a variable phase. However, embodiments of the present invention are not limited thereto. For example, in some embodiments, the base symbol signal may have a substantially (but not entirely) constant envelope with small amounts of amplitude variation. The perturbation signal may correspond to (e.g., map to) a constellation point of a modulation scheme of the transmitter.

As described above, unlike solutions of the related art that either sacrifice spectral performance or power efficiency, or induce significant transmitter processing complexity, the communication system according to some embodiments achieves high capacity constellations generated in the receiver with improved combined spreading gain/spectral efficiency without relying on high-power, and low efficiency linear amplifiers.

The operations performed by the constituent components of the transmitter 100 (e.g., by the encoder 110, the base signal generator 130, and/or the perturbation signal generator 120) may be performed by a "processing circuit" that may include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example, a processing circuit may include two processing circuits, an FPGA and a CPU, interconnected on a PWB.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

The electronic or electric devices and/or any other relevant devices or components according to embodiments of the present disclosure described herein (e.g., the transmitter and the receiver) may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

While the present invention has been illustrated and described with reference to the embodiments thereof, it will be apparent to those of ordinary skill in the art that various suitable changes in form and detail may be formed thereto without departing from the spirit and scope of the present invention, as defined by the following claims and equivalents thereof.

What is claimed is:

1. A method of generating a transmit signal by a transmitter for transmission to a receiver, the method comprising:
   receiving input data;
   generating a base symbol signal;
   generating a perturbation signal based on the input data, at least one of the base symbol signal or the perturbation signal having a constant magnitude and a variable phase, the perturbation signal being configured to induce a non-constant envelope response at the receiver; and
   combining the base symbol signal and the perturbation signal to generate the transmit signal.

2. The method of claim 1, wherein the transmit signal has a constant envelope and a phase modulated by a combination of the base symbol and perturbation signals.

3. The method of claim 1, wherein the perturbation signal corresponds to a constellation point of a modulation scheme of the transmitter.

4. The method of claim 1, wherein the perturbation signal has a constant magnitude and a variable phase.

5. The method of claim 1, wherein the generating the perturbation signal is further based on a modulation scheme comprising binary phase-shift keying (BPSK), forward error correction (FEC), quadrature amplitude modulation (QAM), trellis coded modulation (TCM), QAM with FEC, or QAM TCM.

6. The method of claim 1, further comprising:
   encoding the input data to enable error correction at the receiver,
   wherein the generating the perturbation signal is based on the encoded input data.

7. The method of claim 1, wherein the base symbol signal has a constant magnitude and a variable phase.

8. A method of generating a transmit signal by a transmitter for transmission to a receiver, the method comprising:
   receiving input data;
   generating a base symbol signal;
   generating a perturbation signal based on the input data, at least one of the base symbol signal or the perturbation signal having a constant magnitude and a variable phase; and
   combining the base symbol signal and the perturbation signal to generate the transmit signal,
   wherein the transmit signal is expressed as $$S_{TX}(t) = \Sigma_k s_c(t-kT) s_{p_s[k]}(t-kT),$$

wherein k represents an index of symbols being transmitted, t represents time, T represents a symbol period, $S_{TX}(t)$ is the transmitted signal, $s_c(t)$ is the base symbol signal, and $s_{p_s}(t)$ represents a set of perturbation signals indexed by s and comprising the perturbation signal, and s[k] represents an identified perturbation index s for a symbol k.

9. The method of claim 8, wherein at least two permutation signals of the set of perturbation signals are configured to induce a same symbol at the receiver.

10. The method of claim 8, wherein the base symbol signal $s_c(t)$ and the perturbation signal $s_{p_s}(t)$ are respectively expressed as:

$$s_c(t) = \begin{cases} e^{jc(t)}, & 0 \le t < T \\ 0, & \text{else} \end{cases},$$

$$s_{p_s}(t) = \begin{cases} e^{jp_s(t)}, & 0 \le t < T \\ 0, & \text{else} \end{cases},$$

where c(t) is a phase-modulating signal for the base symbol signal, and $p_s(t)$ is one of a set of phase-modulating perturbation signals indexed by s.

11. The method of claim 10, wherein the phase-modulating signal is a spreading code signal.

12. The method of claim 8, wherein an integral of the perturbation signal $s_{p_s}(t)$ over the symbol period has phase and amplitude components of a corresponding constellation point of a modulation scheme of the transmitter.

13. The method of claim 8, wherein a template signal for interpreting received symbols by the receiver is an unperturbed transmitted signal $S_{TX_0}(t)$ expressed as:

$$S_{TX_0}(t) = \Sigma_k s_c(t-kT).$$

14. The method of claim 8, wherein a phase transition between a consecutive pair of perturbation signals of the set of perturbation signals is continuous and passes through a predetermined phase location.

15. The method of claim 8, wherein a phase transition between a consecutive pair of perturbation signals of the set of perturbation signals is discontinuous.

16. A method of generating a transmit signal by a transmitter for transmission to a receiver, the method comprising:
   receiving input data;
   generating a base symbol signal;
   generating a perturbation signal based on the input data, at least one of the base symbol signal or the perturbation signal having a constant magnitude and a variable phase; and
   combining the base symbol signal and the perturbation signal to generate the transmit signal,
   wherein the transmitter comprises a power amplifier configured to transmit the transmit signal while operating in saturation mode.

17. A system for generating a transmit signal for transmission to a receiver, the system comprising:
   a memory; and
   a processing circuit configured to perform:
      receiving input data;
      generating a base symbol signal;
      generating a perturbation signal based on the input data, at least one of the base symbol signal or the perturbation signal having a constant magnitude and a variable phase, the perturbation signal being configured to induce a non-constant envelope response at the receiver; and
      combining the base symbol signal and the perturbation signal to generate the transmit signal.

18. The system of claim 17, wherein the perturbation signal corresponds to a constellation point of a modulation scheme of the system.

19. The system of claim 17, wherein the perturbation signal has a constant magnitude and a variable phase.

* * * * *